United States Patent
Kim (10) Patent No.: US 8,693,517 B2
(45) Date of Patent: Apr. 8, 2014

(54) SEMICONDUCTOR LASER USING EXTERNAL RESONATOR

(76) Inventor: Jeong Soo Kim, Gongju (KR)

( * ) Notice: Subject to any disclaimer, the term of this patent is extended or adjusted under 35 U.S.C. 154(b) by 201 days.

(21) Appl. No.: 13/060,168

(22) PCT Filed: Aug. 24, 2009

(86) PCT No.: PCT/KR2009/004719
§ 371 (c)(1),
(2), (4) Date: May 17, 2011

(87) PCT Pub. No.: WO2010/021529
PCT Pub. Date: Feb. 25, 2010

(65) Prior Publication Data
US 2011/0211602 A1    Sep. 1, 2011

(30) Foreign Application Priority Data

Aug. 22, 2008   (KR) .................. 10-2008-0082149
Mar. 6, 2009    (KR) .................. 10-2009-0019494

(51) Int. Cl.
*H01S 3/08*    (2006.01)

(52) U.S. Cl.
USPC ............. 372/107; 372/93; 372/97; 372/101; 372/99; 372/102

(58) Field of Classification Search
CPC ... H01S 3/0071; H01S 5/0071; H01S 5/0656; H01S 5/14; H01S 5/141; H01S 5/142; H01S 5/143; H01S 5/145
USPC .................. 372/93, 97, 99, 101, 102, 107
See application file for complete search history.

(56) References Cited

U.S. PATENT DOCUMENTS

| | | | | |
|---|---|---|---|---|
| 4,785,462 A | * | 11/1988 | Keil | 372/92 |
| 5,386,426 A | * | 1/1995 | Stephens | 372/20 |
| 5,392,308 A | * | 2/1995 | Welch et al. | 372/92 |
| 5,566,265 A | | 10/1996 | Spaeth et al. | |
| 6,271,049 B1 | * | 8/2001 | Auracher et al. | 438/29 |

(Continued)

FOREIGN PATENT DOCUMENTS

| | | | |
|---|---|---|---|
| JP | 62298194 A | * | 12/1987 |
| JP | 07-202351 A | | 8/1995 |
| JP | 10-039181 A | | 2/1998 |
| JP | 2003-248960 A | | 9/2003 |

*Primary Examiner* — Jessica Stultz
*Assistant Examiner* — Joshua King
(74) *Attorney, Agent, or Firm* — Drinker Biddle & Reath LLP (57) ABSTRACT

A semiconductor laser using an external resonator. A laser diode chip emits a laser beam in a horizontal direction parallel to the bottom plane of a package, and the travel path of the laser beam is changed into a vertical direction by a reflective mirror next to a laser beam-emitting surface of the laser diode chip. As a result, the beam arrangement of the external cavity is available on a plane parallel to the bottom plane of the package through a lens installed on the vertical travel path of the laser beam. Consequently, the beam is easily arranged. Furthermore, an additional reflective mirror is installed above the lens which changes the vertical travel path into a horizontal travel path, which allows the beam traveling parallel to the bottom plane to be easily arranged through the lens. The production of the package can also be enabled in the configuration where various optical tools are arranged on the bottom of the package. Therefore, the semiconductor laser using an external cavity and having various characteristics can be easily manufactured.

5 Claims, 9 Drawing Sheets

(56) References Cited

U.S. PATENT DOCUMENTS

| | | | |
|---|---|---|---|
| 6,377,592 B1 * | 4/2002 | Auracher et al. | 372/9 |
| 6,463,085 B1 * | 10/2002 | Tayebati | 372/20 |
| 7,280,457 B2 | 10/2007 | Kobayashi et al. | |
| 2005/0018743 A1 * | 1/2005 | Volodin et al. | 372/102 |

* cited by examiner

FIG. 1

PRIOR ART

PRIOR ART

SEMICONDUCTOR LASER USING EXTERNAL RESONATOR

CROSS-REFERENCE TO RELATED APPLICATIONS

This application is the U.S. national phase of the International Patent Application No. PCT/KR2009/004719 filed Aug. 24, 2009, which claims the benefit of Korean Application No. 10-2008-0082149 filed Aug. 22, 2008 and Korean Application No. 10-2009-0019494 filed Mar. 6, 2009, the entire content of which is incorporated herein by reference.

BACKGROUND

1. Field of the Invention

The invention relates to a semiconductor laser, and particularly, to a semiconductor laser which allows a laser beam emitted therefrom to be collimated thus changing the characteristics of the beam.

2. Description of the Related Art

The invention relates to a semiconductor laser, and particularly, to a semiconductor laser which allows a laser beam emitted therefrom to be collimated thus changing the characteristics of the beam.

A semiconductor laser is widely utilized for communications such as optical communications and displays such as laser displays because of the wavelenuth monochromaticity thereof. The characteristics of a laser beam required for communications and displays are extremely differentiated, and it is difficult to satisfy all of the requirements in such various application fields using a typical single semiconductor laser chip. For example, in an actual application of DWDM (dense wavelength division multiplexing) requiring very high monochromaticity of a laser beam, the monochromaticity should have a high SMSR (side mode suppression ratio) of −30 decibel (dB) or more, the wavelength should be very stable, and numerous wavelengths at intervals of 200 GHz, 100 GHz, 50 GHz, 25 GHz, etc. should be used.

Because it is difficult to achieve the requirements in such communication networks using only the single semiconductor chip, additional parts having various functions may be integrated with a semiconductor laser diode chip, for example, a thermo electric cooler for controlling the temperature of the laser diode chip may be installed to one side of the semiconductor laser diode chip, or a wavelength-selective filter able to adjust the oscillation wavelength of the laser diode chip may be provided, thereby satisfying various requirements in communication networks. In particular, methods have been proposed to control the oscillation wavelength of a laser for communication in the form of an external resonator. As such, the external resonator type laser indicates that the feedback of the beam and the laser operation do not occur in the gain medium of the laser but the feedback of the beam takes place in a region different from the gain medium.

A typical single semiconductor chip laser causes the feedback of a laser beam using both ends of the gain medium as a reflective mirror, whereas an external resonator type semiconductor laser is configured such that at least one side of the semiconductor laser is subjected to non-reflective treatment and the feedback of the beam occurs outside the semiconductor gain medium. Thus, various optical devices are disposed between the semiconductor gain medium and the external reflection mirror, thereby manufacturing lasers having a variety of novel characteristics which cannot be obtained when using the typical single semiconductor chip.

Figure 1:
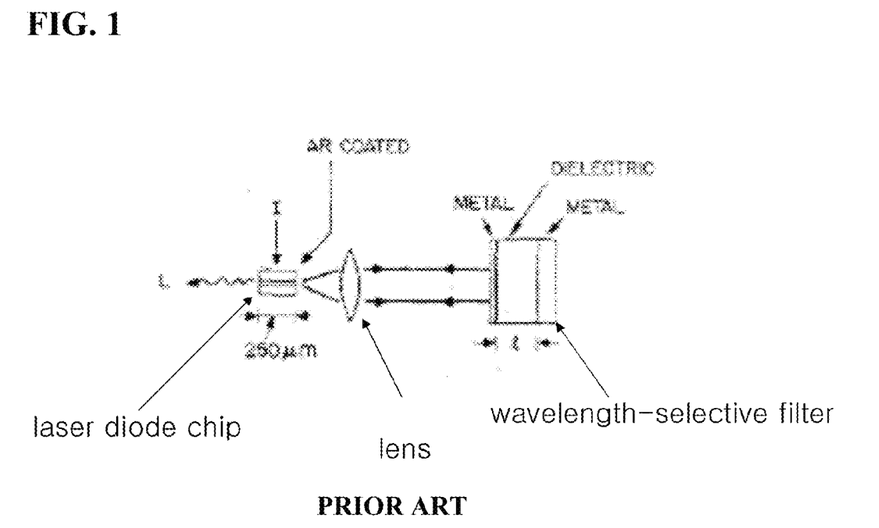
FIG. 1 shows a conventional external resonator type laser manufactured using a laser diode chip, a lens and a wavelength-selective reflection mirror.

FIG. 1 shows the structure of an external resonator type semiconductor laser, published by N. K. Dutta et al. (JOURNAL OF QUANTUM ELECTRONICS, VOL. QE-21, NO. 6, JUNE 1985). As shown in FIG. 1, this laser diode chip is of an edge emitting type which emits light from one side of the laser diode chip and is configured such that the optical axis of the laser diode chip and the optical axis of the lens coincide with each other. Typically, the edge emitting type laser diode chip is assembled so that the wide bottom surface of the chip is attached to the bottom of a package and thus the optical axis of the lens becomes parallel to the bottom surface. Only in the case where the beam emitted from the laser diode chip is fed back to the laser diode chip after collimation using the lens and then determination of the wavelength of the beam by means of a wavelength-selective filter, it becomes possible to control the wavelength using the external resonator as desired in the cited reference of FIG. 1.

Figure 2:
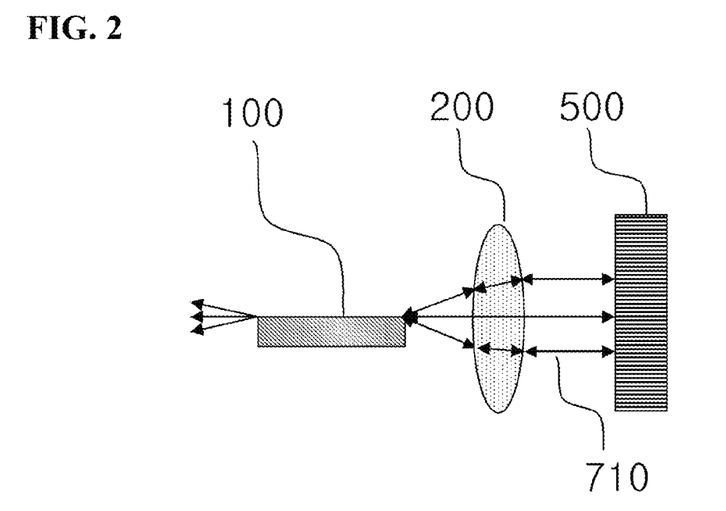
FIG. 2 shows the travel path of a laser beam when all of the optical axis of the laser diode chip, the optical axis of the lens, and the optical axis of the reflection mirror coincide with each other.

FIG. 2 shows the travel path of the beam when the optical axis of a laser diode chip 100, the optical axis of a lens 200 and the optical axis of a final reflection mirror 500 coincide with each other. As used herein, the final reflection mirror 500 indicates a reflection mirror that functions to return a laser beam by a path reverse to a path in which a laser beam enters the reflection mirror at an incident angle normal to the surface of the reflection mirror. As shown in FIG. 2, the laser beam emitted from the laser diode chip 100 at a wide angle is collimated into a parallel beam through the lens 200, and the collimated beam is exactly perpendicularly reflected from the final reflection mirror 500, and thereby the laser beam is fed back to the laser diode chip 100 along the travel path reverse to the travel path from the laser diode chip 100 to the final reflection mirror.

Figure 3:
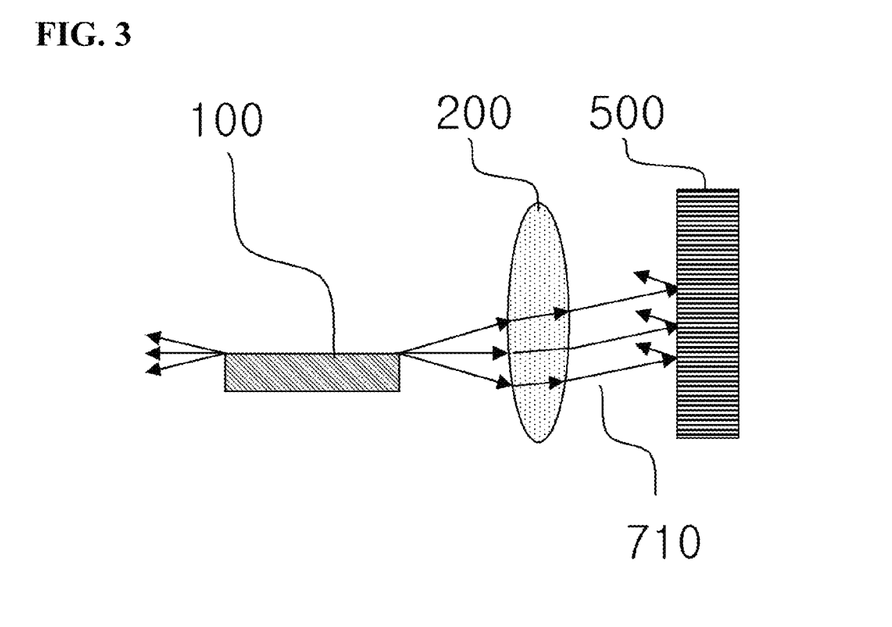
FIG. 3 shows the travel path of a laser beam when the optical axis of the laser diode chip and the optical axis of the reflection mirror coincide with each other but the optical axis of the lens does not coincide therewith.

FIG. 3 shows the travel path of the beam under conditions in which the optical axis directions of the laser diode chip 100 and the final reflection mirror 500 coincide with each other, the optical axis direction of the lends 200 coincides with the laser diode chip 100 and the final reflection mirror 500 but the center line of the optical axis thereof is spaced apart from the center line of the optical axis of the laser diode chip 100. When the optical axis of the laser diode chip 100 is parallelly spaced apart from the optical axis of the lens 200, the optical axis of the laser beam passed through the lens 200 is inclined to the optical axis of the laser diode chip 100. Thus, the laser beam is not perpendicularly incident on the final reflection mirror 500, whereby the laser beam reflected from the final reflection mirror 500 is not fed back to the laser diode chip 100.

Figure 4:
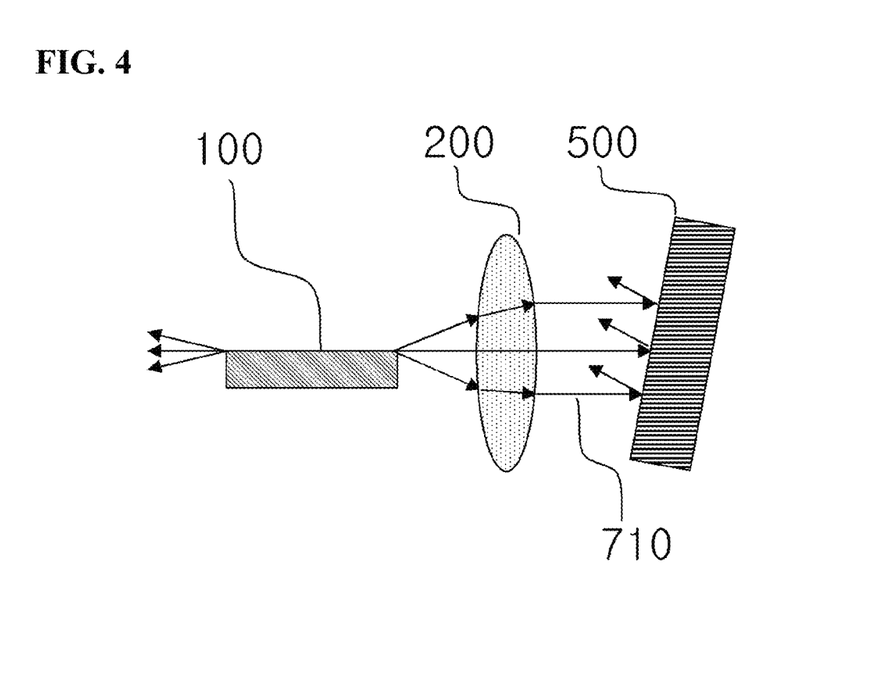
FIG. 4 shows the travel path of a laser beam when the optical axis of the laser diode chip and the optical axis of the lens coincide with each other but the optical axis of the reflection mirror does not coincide therewith.

FIG. 4 shows the travel path of the beam when the optical axis of the laser diode chip 100 and the optical axis of the lens 200 coincide with each other and do not coincide with the optical axis of the final reflection mirror 500. Also in this case, it is obvious that the beam not be fed back to the laser diode chip 100.

Figure 5:
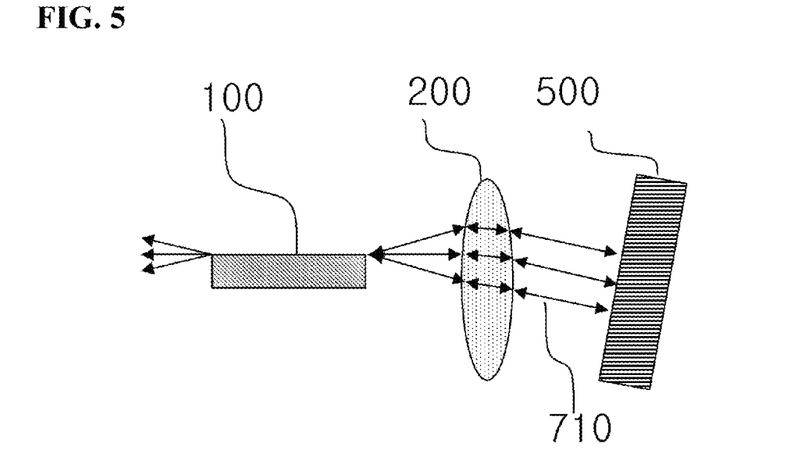
FIG. 5 shows the travel path of a laser beam which is perpendicularly incident on the reflection mirror through the lens under conditions in which the optical axis of the lens is spaced apart from the optical axis of the laser diode chip when the optical axis of the laser diode chip and the optical axis of the reflection mirror do not coincide with each other.

FIG. 5 shows the travel path of the beam under conditions in which the optical axis of the final reflection mirror 500 is inclined to the optical axis of the laser diode chip 100 and the optical axis of the lens 200 is spaced apart from the optical axis of the laser diode chip 100 so that the laser beam passed through the lens is perpendicularly incident on the final reflection mirror 500. The beam which is perpendicularly incident on the final reflection mirror 500 is perpendicularly reflected therefrom. In this case, even when the optical axis of the final reflection mirror 500 does not coincide with the optical axis of the laser diode chip 100, the laser beam emitted from the laser diode chip 100 is reflected from the final reflection mirror 500 and is thus fed back to the laser diode chip 100. That is, in the case of a reflection mirror which is planar, changes in the position of the reflection mirror that does not change the inclined angle to the incident optical axis result in no change in the travel angle of a beam. However, in the case of a lens, when the central optical axis direction of the lens is fixed and the position of the optical axis is changed, the travel angle of a beam may be changed. In the optical system comprising the laser diode chip, the lens and the final reflection mirror, it is difficult to very precisely fix the positions of respective three parts. Hence, these parts are typically configured such that the laser diode chip and the final reflection mirror are first fixed, and the position of the lens is then precisely controlled so that the laser beam emitted from the laser diode chip is perpendicularly incident on the reflection mirror and thus the laser beam reflected from the reflection mirror is fed back to the laser diode chip. For the sake of brief description, the reflection mirror may be used, but this reflection mirror may be manufactured to further include an additional optical element such as a wavelength-selective filter able to select the wavelength of a laser beam or a wavelength-variable filter able to alter the selected wavelength.

Figure 6:
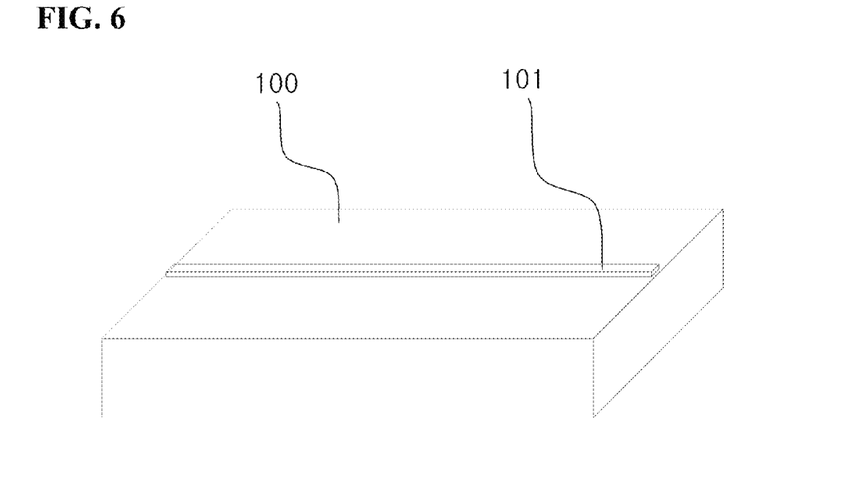
FIG. 6 shows an edge emitting type semiconductor laser.

FIG. 6 shows the structure of a typical edge emitting type semiconductor laser diode chip 100. The typical semiconductor laser diode chip 100 has a cuboid structure in which an active region where a laser beam is produced is provided on the upper portion of the chip 101 and the height of the chip 100 is shorter than the width and length of the chip 100. Such a chip 100 is installed so that the active region is parallel to the bottom plane 810 of a package including the laser diode chip 100 as shown in FIG. 7, in order to effectively remove heat generated from the laser diode chip 100.

Figure 7:
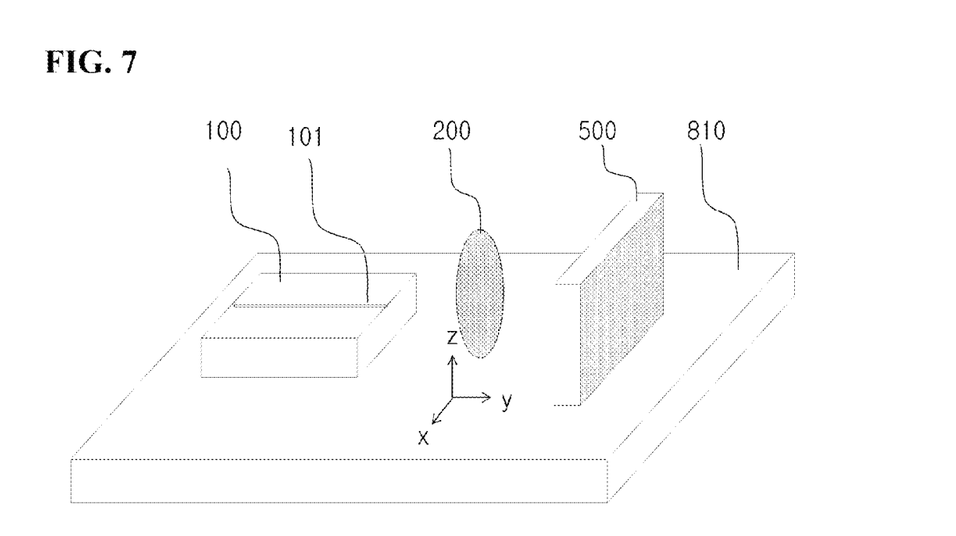
FIG. 7 shows an external resonator type laser manufactured using a laser diode chip, a lens and a reflection mirror.

In the case where the laser diode chip 100 is disposed parallel to the bottom plane 810 of the package and the final reflection mirror 500 is disposed perpendicular to the bottom plane of the package, as described in FIG. 2, the position of the lens 200 should be controlled on the x-z plane of FIG. 7 so that the optical axis of the laser beam emitted from the laser diode chip 100 and the optical axis of the final reflection mirror 500, which do not coincide with each other, are made to coincide with each other. Thus, the position of the lens should be controlled in the form of being placed in the air with respect to the bottom plane 810 of the package, and special elements for fixing the position-controlled lens 200 at the controlled position should be further added. In order to move the lens 200 on the x-z plane, the height of the lens 200 cannot be fixed, and thus the lens 200 should be undesirably continuously gripped until the lens 200 is arranged and fixedly attached to additional lens supports which are not shown in the drawing.

In the cited reference of FIG. 1 using the wavelength-selective filter which is of a reflection type, the external resonator type laser is employed in which the wavelength-selective filter itself functions as a reflection mirror, but this method is not well utilized because it is difficult to control the characteristics of the wavelength-selective filter. Separately, there are devised methods in which the wavelength-selective filter is manufactured in the form of a transmission type and an additional reflection mirror is used, and these methods facilitate the wavelength-selective filter to be imparted with various characteristics and are thus mainly adopted in the external resonator type laser.

Figure 8:
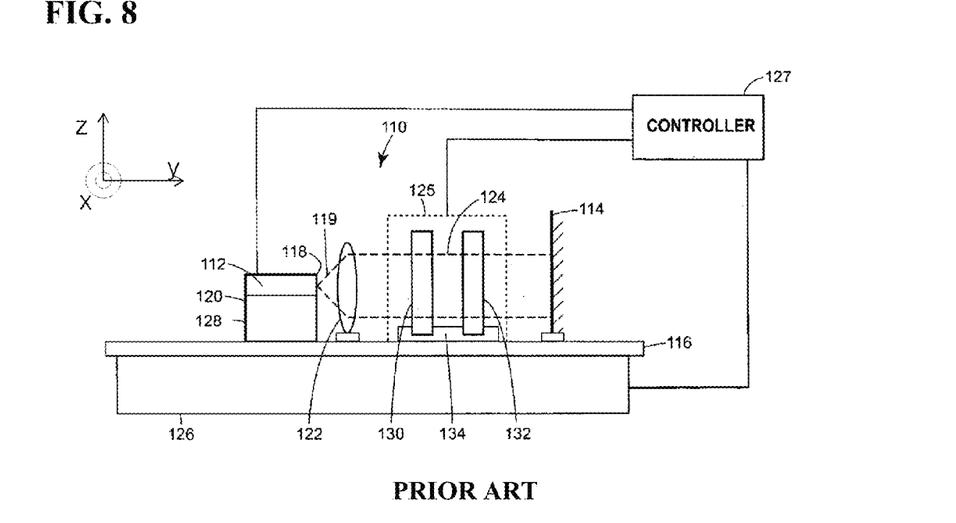
FIG. 8 shows a conventional wavelength-variable external resonator type laser comprising a laser diode chip, a lens, a wavelength-variable filter and a reflection mirror.

FIG. 8 shows the structure of an external resonator type laser which uses a transmission wavelength-selective filter able to alter the selected wavelength and is of a wavelength-variable type able to alter the wavelength selected by the wavelength-selective filter. (U.S. Pat. No. 7,295,582 B2 M. E. McDonald et al.,) in the description of FIG. 5, the lens is mentioned in which its height is fixed. However, in the case where the laser diode chip, the lens and the reflection mirror are fixed at predetermined positions, the optical axis of the laser beam travelling to the reflection mirror through the lens must exactly coincide with the optical axis of the reflection minor at a very high precision so that the beam passed through an Etalone filter is perpendicularly incident on the reflection mirror and perpendicularly reflected therefrom.

Figure 9:
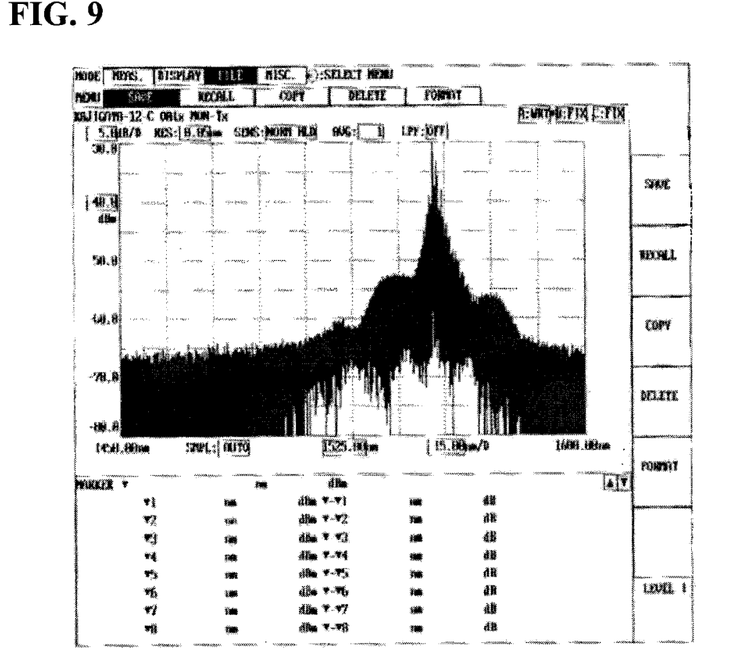
FIG. 9 shows the spectrum of the semiconductor laser when the beam array is efficiently ensured in the structure of FIG. 7.
Figure 10:
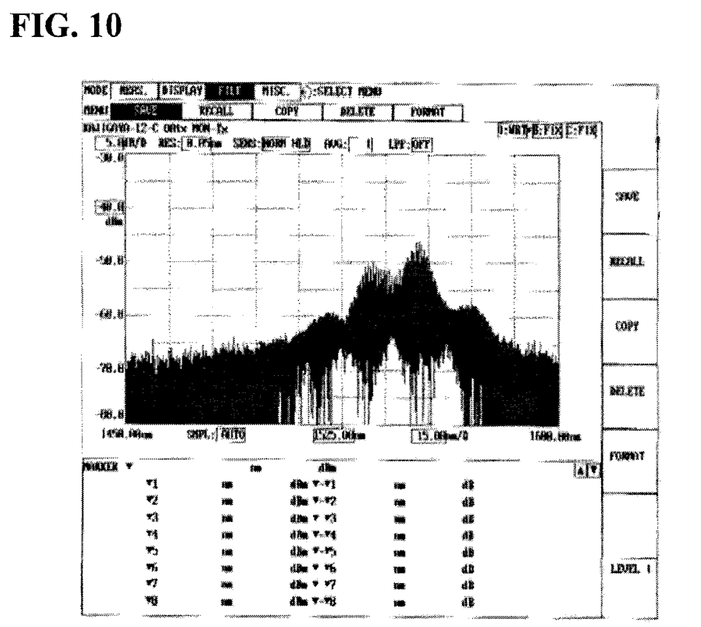
FIG. 10 shows the spectrum of the semiconductor laser when the lens is moved by 0.5 µm in a direction perpendicular to the optical axis in the structure of FIG. 9.

FIG. 9 shows the results of arrangement of the laser diode chip 100, the lens 200 and the final reflection mirror 500 in the structure of FIG. 7, as tested in the laboratory. FIG. 9 shows a laser spectrum when the laser beam travelling to the final reflection mirror 500 through the lens 200 of FIG. 7 very highly coincides with the optical axis of the final reflection mirror 500, and FIG. 10 shows a laser spectrum when the lens is horizontally moved by about 0.5 µm all in the x direction of FIG. 7 with the optical axis direction of the lens 200 being maintained under conditions of FIG. 9. In this case, the laser diode chip 100 and the final reflection mirror 500 are pre-fixed and thus the optical axes thereof are not changed, and the optical axis direction of the laser beam which reaches the final reflection mirror 500 through the lens 200 becomes slightly distorted due to the movement of the lens 200.

The spectrum characteristics of two types of FIGS. 9 and 10 are remarkably different, which means that the ratios of the beam reflected from the final reflection mirror and fed back to the laser diode chip 100 differ considerably from each other. Accordingly, the lens 200 should be very precisely arranged so that the laser beam incident on the final reflection mirror 200 enters the final reflection mirror 500 at a very exact normal angle. So, the arrangement precision of the lens 200 on the x-z plane in FIG. 4 should be preferably less than +/−0.5 µm under optimal conditions, and more preferably less than +/−0.1 tall under optimal conditions.

In FIG. 7, the sensitivity of position precision of the lens 200 in the y axis direction is remarkably lower compared to the x axis and y axis directions, and thus may be about 5 µm. Specifically, the arrangement precision of the lens should be preferably less than 0.1 µm with respect to the plane perpendicular to the optical axis, but allows about 5 µm in the optical axis direction of the lens. Thus, precise arranging becomes possible in such a manner that the lens, the position of which was preset in the optical axis direction, is manufactured and then moved on the perpendicular plane of the optical axis and thus may be precisely arranged. The comparatively high position precision of about 0.5 to or 0.1 to is very difficult to achieve using the process of individually assembling the laser diode chip, the lens and the final reflection mirror. So, there is typically employed a method in which a laser diode chip and a final reflection mirror are preset and then a lens is arranged at a position where a laser beam emitted from the laser diode chip is reflected from the final reflection mirror and is the most effectively fed back to the laser diode chip. Accordingly, In FIG. 5, the height of the lens should be fixed after very precisely arranging the lens, and thus a special element for precisely arranging and fixing the lens on the x-z plane is required.

An aspect of the invention is to provide a method in which the lens 200 is arranged/attached on the x-y plane instead of being arranged/attached on the x-z plane as seen in FIG. 7, and thereby the position of the lens in contact with the bottom plane of a package is controlled, so that the optical axis of the laser beam incident on the final reflection mirror and the optical axis of the final reflection mirror coincide with each other. In the invention, the height of the lens is an optical axis direction of a laser beam, and thus there is no need for a very high precision of about 0.1 µm, and the height of the lens may be previously fixed by being attached to the preset lens supports. Accordingly, the lens supports function to support the lens thus ensuring the stable position, thereby eliminating the need to continuously grip the lens during assembling the external resonator type laser and arranging the lens. Furthermore, a higher degree of freedom may be imparted in fabricating the lens supports for holding the lens and fixing the lens supports having the lens attached thereto on the bottom plane of a package.

FIG. 8 shows an external resonator type semiconductor laser in which a wavelength-variable Etalone filter able to control the wavelength of the transmitted beam is interposed between the semiconductor gain medium and the reflection mirror. In the external resonator type laser, a semiconductor laser having various characteristics may be manufactured depending on the characteristics of the optical device interposed between the gain medium and the reflection minor. Another aspect of the invention is to provide various embodiments of the external resonator type laser which is easily constructed using the idea of the application.

SUMMARY

Accordingly, the invention has been made keeping in mind the above problems encountered in the related art, and an object of the invention is to provide a method of manufacturing an external resonator type laser in which a laser beam emitted from a laser diode chip at an angle parallel to the bottom plane of a package is made to travel in a vertical direction perpendicular to the bottom plane of the package using a 45° reflection mirror and then passes through a lens having an optical axis perpendicular to the bottom plane. Also the invention is intended to provide a method of manufacturing an external resonator type laser, in which a laser beam emitted from a laser diode chip at an angle parallel to the bottom plane of a package is made to travel in a vertical direction perpendicular to the bottom plane of the package using a 45° reflection minor and then passes through a lens having an optical axis perpendicular to the bottom plane, after which the laser beam is returned so that its optical axis is parallel to the bottom plane of the package using another 45° reflection mirror and then passes through a final reflection mirror having an optical axis parallel to the bottom plane of the package.

The description of the invention in which the laser beam emitted from the laser diode chip is parallel to the bottom plane and is made to travel in the vertical direction perpendicular to the bottom plane of the package using the 45° reflection mirror is merely illustrative, and is not essential to the beam array. If the position of the lens is moved on the plane parallel to the bottom plane to thus achieve the beam array, corresponding to the main idea of the invention, is possible, different angles may be applied.

In the invention, because the plane where the lens is arranged is an x-y plane in lieu of an x-z plane, a lens and lens supports are arranged on the x-y plane with the height of the lens being fixed using appropriate lens supports, thereby achieving the beam array. Accordingly there is no need to continuously grip the lens in the course of arranging and fixing the lens.

In order to accomplish the above objects, the invention provides a semiconductor laser using an external resonator, comprising a laser diode chip which emits a laser beam from one side thereof, a lens for collimating the emitted laser beam into a parallel beam, and a wavelength-selective filter for reflecting part of the laser beam which is incident through the lens so that the laser beam is fed back to the laser diode chip, wherein a reflection mirror is provided at the one side of the laser diode chip so that the laser beam emitted in a horizontal direction from the one side of the laser diode chip is reflected in a vertical direction and is thus incident on the lens and the wavelength-selective filter which are disposed above the reflection mirror.

In addition, the invention provides a semiconductor laser using an external resonator, comprising a semiconductor laser diode, wherein in an external resonator type laser in which an optical axis direction is changed two or more times, among planes including an optical axis before the optical axis direction is changed and an optical axis after the optical axis direction is changed, a first optical axis direction change plane and a second optical axis direction change plane are configured so as not to be parallel to each other, and among the planes defined by a beam travel path along the changed optical axis directions, the first optical axis direction change plane is perpendicular to a bottom plane on which a laser diode chip is placed and the second optical axis direction change plane is parallel to the bottom plane on which the laser diode chip is placed.

In this case, the lens may be supported at both sides thereof by means of lens supports, and a space may be formed under the lens between the lens supports and the reflection mirror and the laser diode chip may be provided in the space.

Also, a lens and a second reflection mirror may be integratedly manufactured.

According to the invention, when an external resonator type laser is manufactured using a laser diode chip installed to the bottom plane of a package to emit a laser beam in a horizontal direction parallel thereto, the optical axis direction of the laser is perpendicularly changed to the bottom plane of the package using a 45° reflection mirror, so that the space where the lens is arranged becomes an x-y plane parallel to the bottom plane. Thereby, the lens is attached to lens supports which support the lens at a predetermined height thus achieving the beam array, thus eliminating the need to continuously grip the lens in the course of arranging/fixing the lens. Also, a plurality of lenses can be simultaneously fixed, thus increasing productivity. Also, parts for fixing the lens can be variously selected and thus lower-priced lens supports can be used, thereby reducing the manufacturing cost.

DESCRIPTION OF THE PREFERRED EMBODIMENTS

Hereinafter, preferred embodiments of the invention, which are not construed to limit the invention, will be described in detail with reference to the accompanying drawings.

Figure 11:
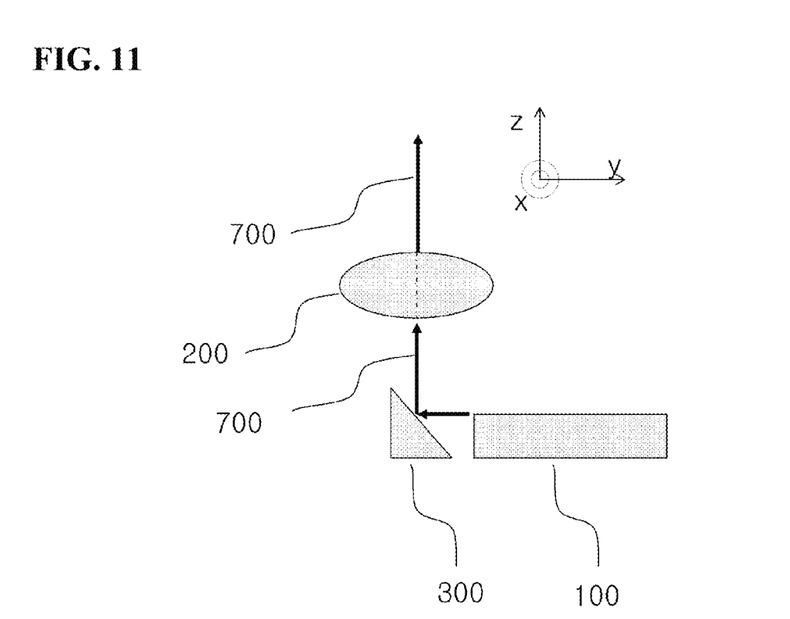
FIG. 11 shows the travel path of a laser beam when the laser beam incident on a lens and the optical axis of the lens coincide with each other under conditions in which a 45° reflection mirror is disposed at one side of a laser diode chip and the lens is disposed above the 45° reflection mirror, according to the invention.
Figure 12:
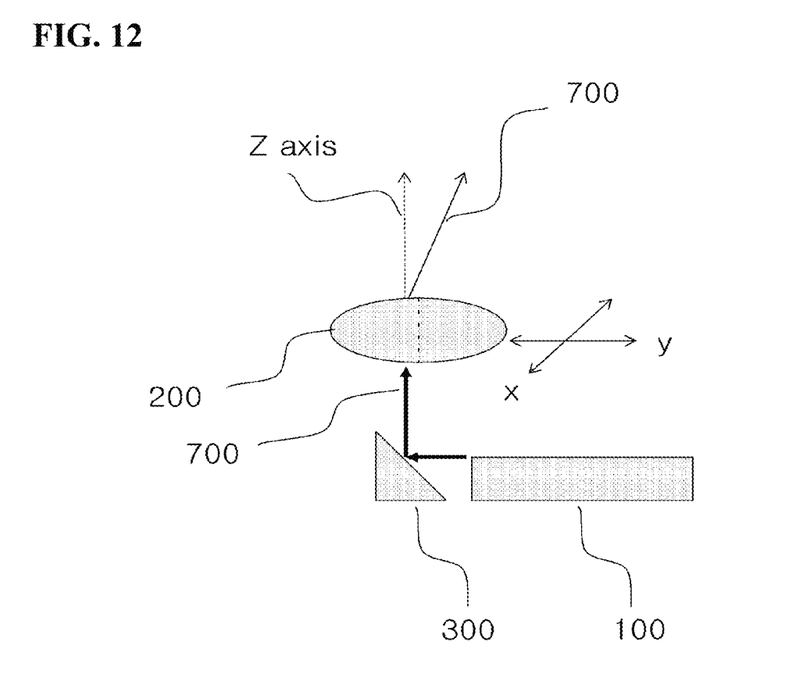
FIG. 12 shows the travel path of a laser beam when the laser beam incident on a lens and the optical axis of the lens do not coincide with each other under conditions in which a 45° reflection mirror is disposed at one side of a laser diode chip and the lens is disposed above the 45° reflection mirror, according to the invention.

FIGS. 11 and 12 show the principle of operating a folder type resonator according to the invention. In these drawings, for the sake of brief description, only the optical axis of a laser beam diverged in a wide angle range from a laser diode chip 100 is depicted. The laser beam which is emitted in a horizontal direction parallel to the bottom plane of a package (not shown) including the laser diode chip 100 from one side of the laser diode chip 100 is reflected by a 45° reflection mirror 300, so that the optical axis direction thereof is changed into a vertical direction. The optical axis of the lens 200 is disposed perpendicular to the bottom plane of the package not shown in the drawing, and the laser beam diverged in the wide angle range from the laser diode chip 100 is collimated by the lens 200 and thus converted into a parallel beam. For the sake of brief description, on the assumption that the optical axis of the laser beam incident on the lens 200 is exactly in a z axis direction and the optical axis of the lens 200 is also exactly in a z axis direction, as shown in FIG. 11, when the optical axis of the laser beam, the direction of which is changed into the vertical direction, coincides with the optical axis of the lens 200, the optical axis of the beam passed through the lens 200 becomes identical to the optical axis of the laser beam incident on the lens 200. However, as shown in FIG. 12, when the lens 200 is moved on an x-y plane, the optical axis of the laser beam passed through the lens 200 deviates from the z axis direction. The optical axis direction of the laser beam passed through the lens 200 deviating from the z axis direction depends on the distance between the optical axis of the lens 200 and the optical axis of the laser beam incident on the lens 200 which are spaced apart from each other, and on the direction thereof. The reference numeral 700 designates the optical axis of a laser.

Figure 13:
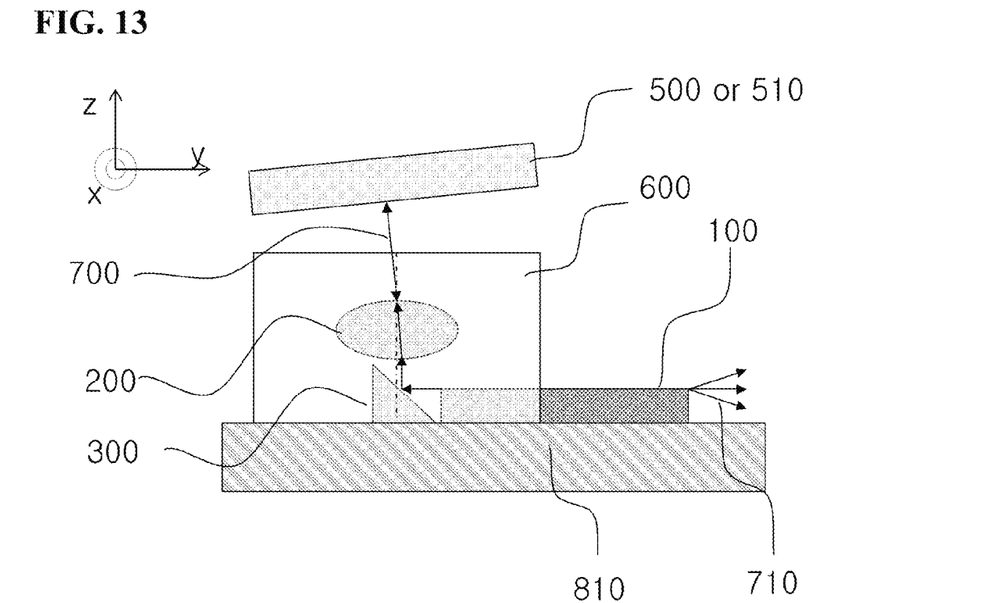
FIG. 13 shows the travel path of a laser beam in a resonator comprising a laser diode chip, a 45° reflection mirror, a lens, and a final reflection mirror disposed above the lens, according to the invention.

FIG. 13 shows the travel path of a laser beam by means of the external resonator of FIG. 12 for changing the optical axis direction, in which the optical axis direction of the laser beam emitted from the laser diode chip 100 is changed by the 45° reflection mirror 300, after which such a laser beam passes through the lens 200, is reflected from the final reflection mirror 500 or 510 disposed above the lens 200, and then fed back to the laser diode chip 100. In the assembling procedure, only when the beam that reaches the final reflection mirror 500 or 510 through the lens 200 is exactly perpendicular to the final reflection mirror 500 or 510, the beam reflected from the final reflection mirror 500 or 510 may be fed back to the laser diode chip 100. The reference numeral 710 designates the travel path of the laser beam, and the reference numeral 810 designates the bottom of the package.

In FIG. 13, on the assumption that the laser beam the direction of which is changed by the 45° reflection mirror 300 is exactly in a z axis direction, when the optical axis of the lens 200 exactly coincides with the optical axis of the laser beam incident on the lens 200, the laser beam passed through the lens 200 becomes exactly a z axis direction. In this case, only when the optical axis of the final reflection mirror 500 or 510 is exactly in a z axis direction, the laser beam may be effectively fed back. However, in the actual assembling procedure, the optical axis of the final reflection mirror 500 or 510 may be inclined from the vertical direction In this case, when the lens 200 is moved on the x-y plane, the optical axis of the laser beam passed through the lens 200 deviates from the z axis. Also, when the lens is moved on the x-y plane so that the optical axis of the laser beam passed through the lens 200 coincides with the optical axis of the final reflection mirror 500 or 510, the laser beam emitted from the laser diode chip 100 is perpendicularly incident on the final reflection mirror 500 or 510, and thus the laser beam reflected from the final reflection mirror 500 or 510 is fed back to the laser diode chip 100 along the travel path reverse to the travel path of the laser beam until reaching the reflection mirror. Such characteristics are applied without change even when the laser diode chip 100 is not accurately installed in a horizontal direction.

The case of FIGS. 11 to 13 may be used when the laser beam emitted in a horizontal direction is changed in a vertical direction, passes through the lens 200, and is then reflected from the final reflection mirror 500 or 510. The final reflection mirror 500 or 510 of FIG. 8 may be used together with another optical device having transmission characteristics. In this case, however, various optical devices requiring the collimated laser beam should be fabricated in the form of overlapping above the lens 200, and the fabrication thereof becomes difficult. The form in which various optical devices are arranged on the bottom plane of the package as shown in FIG. 8 facilitates the assembling procedure, and makes it easy to assemble additional optical devices having a variety of functions.

Figure 14:
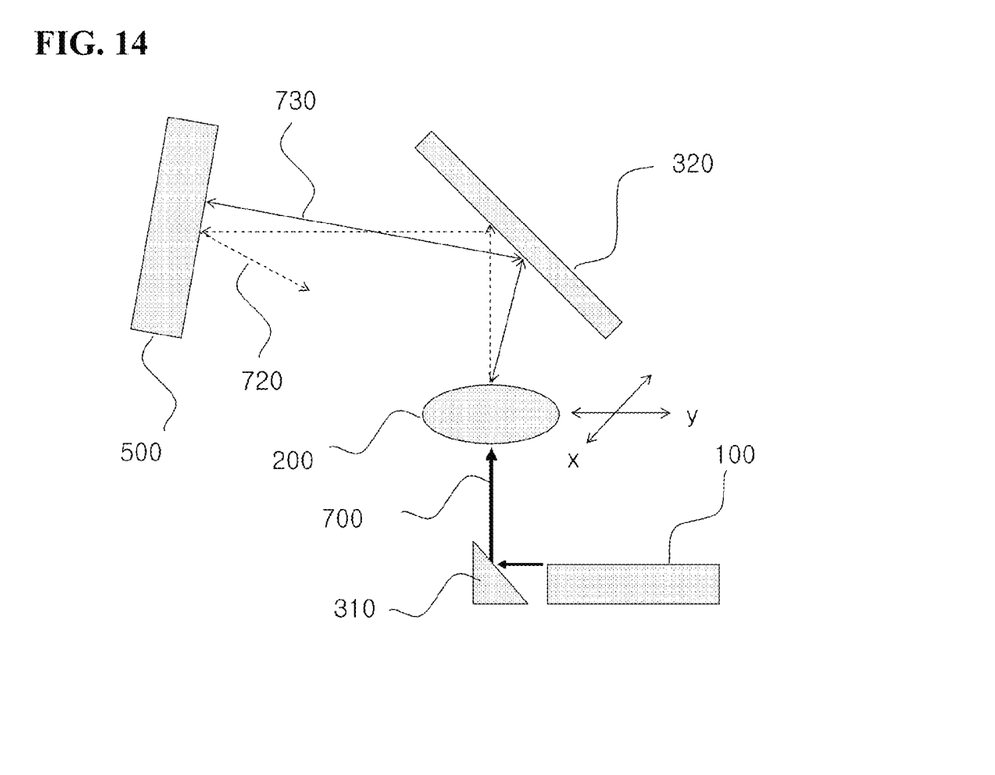
FIG. 14 shows the travel path of a laser beam in a resonator comprising a laser diode chip, a 45° reflection mirror, a lens, a second 45° reflection mirror disposed above the lens, and a final reflection mirror, according to the invention.

FIG. 14 shows a case where a laser beam emitted in a horizontal direction parallel to the bottom plane of a package is changed into a vertical direction, after which the optical axis direction is changed again into a horizontal direction thus returning the optical axis. In FIG. 14, the laser beam emitted in a horizontal direction from the laser diode chip 100 is reflected by a first 45° reflection mirror 310 and then travels toward the lens 200.

As such, on the assumption that the optical axis of the lens 200 is vertical and exactly coincides with the optical axis of a laser and also that a second 45° reflection minor 320 has an accurate inclined angle of 45° to a vertical plane and also that the final reflection mirror 500 is inclined to the vertical plane, the laser beam passed through the lens 200 is perpendicularly turned by the second 45° reflection mirror 320 and thus the optical axis of the beam becomes horizontal. Because the final reflection mirror 500 deviates from the vertical plane, the laser beam reflected from the final reflection mirror 500 is not returned to the lens 200. The travel path of such a laser beam is represented by the dotted line 720.

In the case where the optical axis of the final reflection mirror is not horizontal in this way, when the position of the lens 200 is moved on the x-y plane, the optical axis of the laser beam passed through the lens 200 deviates from the vertical direction as represented by the straight line 710 in the drawing and thus the laser beam reflected from the second 45° reflection mirror 320 cannot also be in the horizontal direction The direction of the beam passed through the second 45° reflection mirror 320 may be controlled by the horizontal movement of the lens 200. Hence, the position of the lens is moved in a direction of offsetting the inclined angle of the final reflection mirror 500, so that the beam passed through the second 45° reflection mirror 320 may be perpendicularly incident on the final reflection mirror 500 upon entering the final reflection mirror 500.

In this case, the laser beam reflected from the final reflection mirror 500 travels in a direction reverse to the travel path of a beam until reaching the final reflection mirror 500, and is thus fed back. In this configuration, the laser beam passed through the second 45° reflection mirror 320 travels in a horizontal direction parallel to the bottom plane of the package not shown in the drawing, thus making it possible to attach various optical devices for determining the characteristics of the external resonator type laser as shown in FIG. 5 to the bottom plane of the package. The external resonator in which the optical axis direction is changed two times in this way is referred to as a double folder type external resonator.

Figure 15:
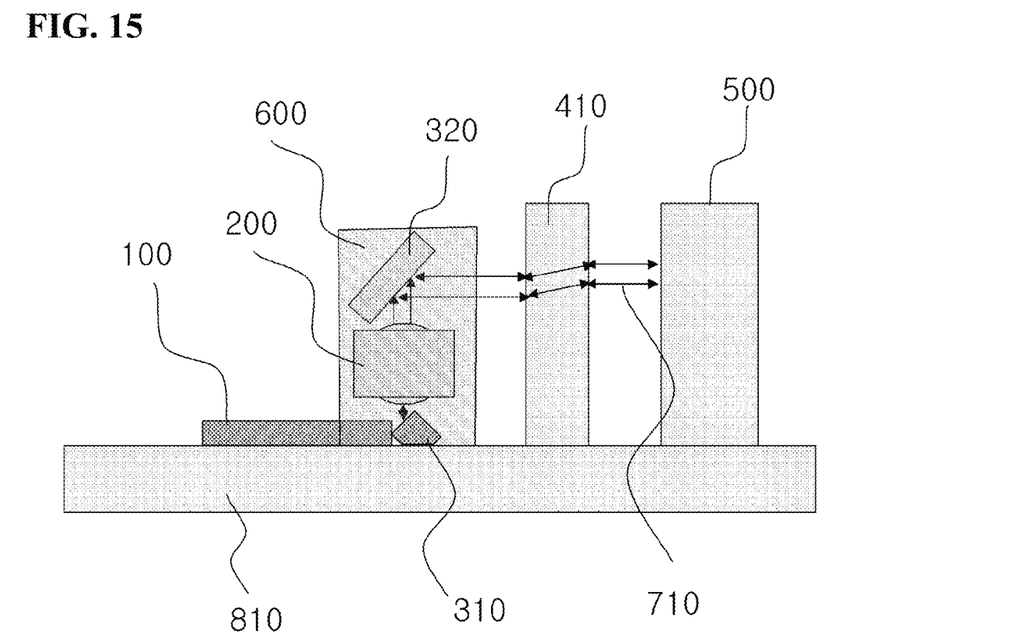
FIG. 15 shows a wavelength-variable laser having a double folder type resonator according to an embodiment of the invention.

FIG. 15 shows the wavelength-variable laser characteristics as represented in FIG. 8 using the double folder type external resonator of FIG. 14, according to an embodiment of the invention. The wavelength-variable filter 410 of FIG. 15 is a transmission wavelength-variable filter in which the wavelength of a laser beam transmitted is altered by the physical environment controlled outside. Such a transmission wavelength-variable filter 410 may include a wavelength-variable filter using thermal expansion, use of changes in refractive index depending on the applied voltage of liquid crystal, use of changes in refractive index depending on the temperature of polymer, etc.

The structure of FIG. 15 is the same as that of FIG. 8 in terms of the travel direction of light, the configuration of the wavelength-variable filter 410 and the configuration of the final reflection mirror 500, with the exception that the travel height of a beam varies by the structure of the double folder type resonator. Whereas the lens is moved on the x-z plane and the position thereof is thus controlled in FIG. 8, the lens 200 is moved on the x-y plane to thus achieve the beam array in FIG. 15.

Figure 16:
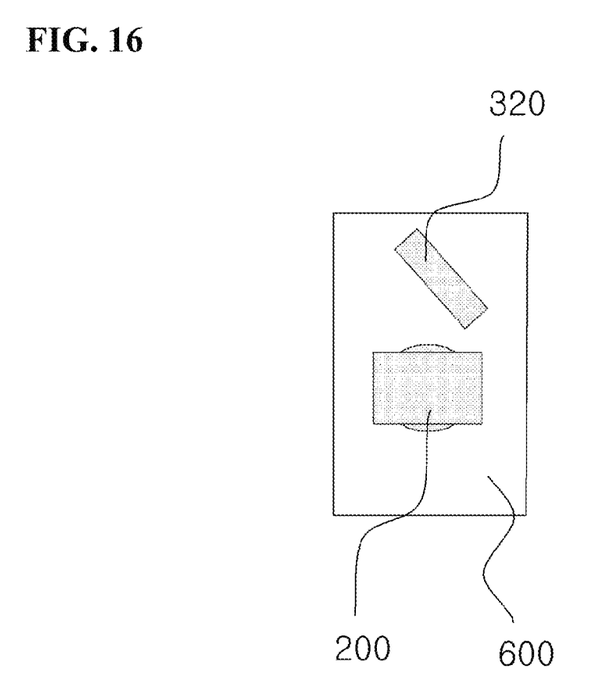
FIG. 16 shows one side of a lens block comprising a lens and lens supports, according to the invention.
Figure 17:
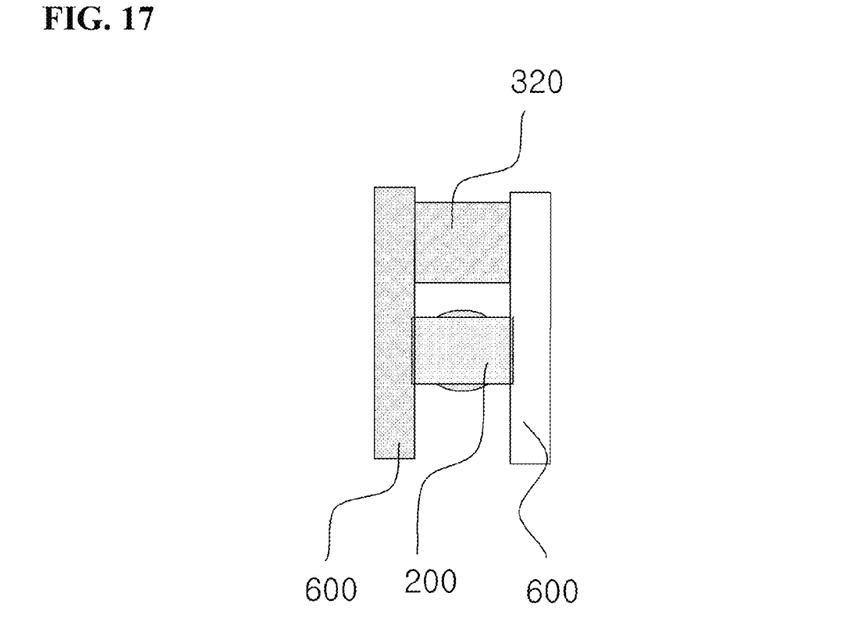
FIG. 17 shows the other side of the lens block comprising a lens and lens supports, according to the invention.

FIGS. 16 and 17 are side views of the double folder type structure in which the lens and the second 45° reflection mirror are attached to two lens supports 600 for supporting them. Specifically, the lens 200 and the second 45° reflection mirror 320 are fixedly attached to two lens supports 600 parallel to each other so that the laser diode chip 100 may be disposed under the lens 200. The lens supports 600, the lens 200 and the second 45° reflection mirror 320 are referred to together as a lens block. The laser diode chip and the first 45° reflection mirror are disposed at a position under the lens 200 corresponding to a space between the two lens supports 600. The lens supports 600 function to place the lens 200 at a predetermined height without external support, and the lens is arranged on the x-y plane and the position thereof may be fixed, with the lens block being attached to the bottom plane of the package not shown in the drawing.

As shown in FIGS. 16 and 17, the lens is fixed using the lens supports which function to place the lens at a predetermined height, fix the lens and be movable in the form of a single body with the lens. When such lens supports are disposed at one side of the laser diode chip, the position of the lens may be maintained by means of the lens supports, without the need to grip the lens, and thus the lens may be arranged by moving the position of the lens supports, ultimately achieving the beam array. Also even when the lens supports are fixed to the bottom plane of the package, there is no need to grip the lens.

This method is advantageous because when the lens supports are fixed to the bottom plane of the package, the lens may be fixed using thermosetting epoxy that requires a long fixing time, and thus fixing a plurality of lens supports may be performed at one time. This method is adapted for mass production. Also, the lens supports may be made of any material such as metal, ceramic, plastic, etc., and the cost for fabricating the lens-fixing device is low.

A method typically used in the package requiring precise lens arrangement includes, in order to fix the lens on the x-z plane, coating the outer surface of the lens with metal, moving the lens on the x-z plane using lens supports made of metal so as to achieve the beam array, and then subjecting the metal of the outer surface of the lens and the metal of the lens supports to laser welding. Thus, this method requires an expensive laser welder device for fixing the lens, but the invention requires only a hot plate in order to fix the lens. Also although arranging and fixing of the lens are separately performed for a single product in the conventional method, a plurality of products can be fixed at one time according to the method. In the invention, the case where the lens and the second 45° reflection mirror are fixedly attached in the form of a single body with the lens supports is illustratively described, in which the second 45° reflection mirror may be separated from the supports.

Generally, the active region of the semiconductor laser diode chip is largely divided into a buried hetero-structure and a ridge structure. In the buried hetero-structure, the divergence angles of the laser beam diverged in the wide angle range from the laser diode chip are similar on the vertical plane and the horizontal plane. However, in the ridge structure, the distribution of such divergence angles differs considerably on the vertical plane and the horizontal plane.

For example, in a typical buried hetero-structure, the divergence angle of a laser beam diverged from the laser diode chip has a full width at half maximum (FWHM) of about 30 in both the vertical direction and the horizontal direction, but in the ridge structure the divergence angles in the horizontal and vertical directions have FWHMs of about 10° and about 40° which differ greatly. In the buried hetero-structure in which horizontal and vertical divergence angles are symmetric, it is easy to collimate the laser beam using a single lens. However, in the ridge structure in which the divergence angles are very different in the horizontal and vertical directions, it is difficult to effectively collimate the laser beam using a single lens.

Figure 18:
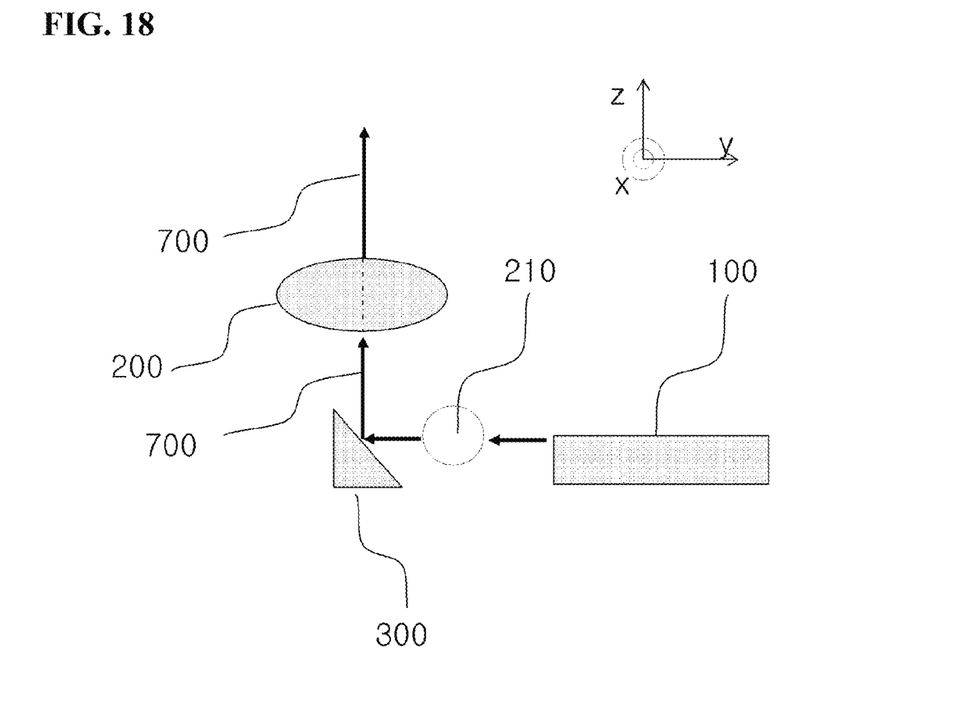
FIG. 18 shows the configuration in which the lens is disposed between the semiconductor laser diode chip and the 45° reflection mirror that causes the laser beam to travel in a vertical direction, according to the invention.

In this case, as shown in FIG. 18, a second lens 210 may be used between the laser diode chip 100 and the first 45° reflection mirror 310. The second lens 210 is fixedly attached at a preset position unlike the lens 200, and the lens 200 which is movable using the laser beam passed through the second lens 210 is moved, thus achieving the beam array by the principle explained in FIGS. 1 to 17. Typically in the ridge structure, the vertical divergence angle of the laser diode chip 100 is very large, and the horizontal divergence angle thereof is narrow. A cylindrical lens is focused only on any one component among two vertical/horizontal optical components, and allows the other component to pass therethrough. When the cylindrical lens is used, the laser beam diverged in the form of having very different divergence angles with respect to the vertical/horizontal planes from the laser diode chip may be effectively converted to have similar divergence angles. Accordingly, it is preferred that the second lens 210 be a cylindrical lens.

DESCRIPTION OF REFERENCE CHARACTERS

100: laser diode chip
101: active region of laser diode chip
200: lens
210: second lens
300: 45° reflection mirror
310: first 45° reflection mirror
320: second 45° reflection mirror
410: Etalone filter able to alter wavelength of transmitted beam
500: final reflection mirror
510: final reflection mirror having reflection type wavelength-selective filter function
600: lens support
700: optical axis of laser
710: travel path of laser beam
720: optical axis path when beam array is not ensured by lens
720: optical axis path when beam array is ensured by lens
810: bottom of package

The invention claimed is:

1. A semiconductor laser using an external resonator, comprising: a laser diode chip that emits a laser beam; a first reflection mirror that reflects the laser beam into a first direction, wherein the first direction is perpendicular to an arrangement plane that is parallel to a bottom plane of a package for the laser diode chip; a lens having an optical axis disposed in the first direction, the lens configured to receive the laser beam from the first reflection mirror and to collimate the laser beam into a parallel beam; a second reflection mirror that reflects the parallel beam from the lens into a second direction; a third reflection mirror that reflects the parallel beam from the second reflection mirror back to the second reflection mirror; and a lens support configured to support the lens; wherein the lens support is moveable in the arrangement plane such that an incident angle of the parallel beam onto the third reflection mirror is perpendicular to an optical axis of the third reflection mirror for feedback of the parallel beam to the laser diodes chip; and wherein the lens support comprises first and second supports, wherein the lens and the second reflection mirror are disposed into a space between the first and second supports and the first reflection mirror is positioned under the space.

2. The semiconductor laser of claim 1, wherein the lens and the second reflection mirror are integratedly manufactured into the lens support.

3. The semiconductor laser of claim 1, further comprising a wavelength-variable filter positioned between the lens support and the third reflection mirror that reflects part of the parallel beam which is incident through the lens so that the parallel beam is fed back to the laser diode chip.

4. The semiconductor laser of claim 1, wherein the lens support is configured to support the lens at a predetermined height from the bottom plane of the package.

5. The semiconductor laser of claim 1, wherein the lens support is configured to be fixed to the bottom plane of the package after movement of the lens support such that the incident angle of the parallel beam onto the third reflection mirror is perpendicular to the optical axis of the third reflection mirror for feedback of the parallel beam to the laser diode chip.

* * * * *